United States Patent [19]
Bledsoe

[11] Patent Number: 4,796,073
[45] Date of Patent: Jan. 3, 1989

[54] FRONT-SURFACE N+ GETTERING TECHNIQUES FOR REDUCING NOISE IN INTEGRATED CIRCUITS

[75] Inventor: Jerry L. Bledsoe, Tucson, Ariz.

[73] Assignee: Burr-Brown Corporation, Tucson, Ariz.

[21] Appl. No.: 931,211

[22] Filed: Nov. 14, 1986

[51] Int. Cl.[4] .......................................... H01L 29/72
[52] U.S. Cl. ...................................... 357/34; 437/10; 437/12
[58] Field of Search ............................ 357/34; 148/1.5

[56] References Cited

U.S. PATENT DOCUMENTS

| | | | |
|---|---|---|---|
| 3,874,936 | 4/1975 | d'Hervilly et al. | 148/1.5 |
| 3,929,529 | 12/1975 | Poponiak | 148/191 |
| 3,933,530 | 1/1976 | Mueller et al. | 148/1.5 |
| 4,053,335 | 10/1977 | Hu | 148/174 |
| 4,061,506 | 12/1977 | McElroy | 148/1.5 |
| 4,069,068 | 1/1978 | Beyer et al. | 148/1.5 |
| 4,205,332 | 5/1980 | Conti et al. | 357/34 |
| 4,371,403 | 2/1983 | Ikubo et al. | 148/1.5 |

OTHER PUBLICATIONS

"Gettering Technique", Barson et al., IBM Technical Disclosure Bulletin vol. 15, No. 6, Nov. 1972.
"Gettering Utilization Implant Damage and Highly Disordered Epitaxial Layer", Poponiak, et al., IBM Tech. Discl. Bulletin, vol. 19, No. 6.
"Ion-Implanted Gettering at Elevated Temperatures", Beyer et al. IBM Technical Discl. Bulletin, vol. 20, No. 8, Jan. 1978.
"Argon Implanation Gettering of Bipolar Devices", Poponiak et al., J. Electrochem Soc., Nov. 1977, pp. 1802–1805, vol. 124, No. 11.
"Gettering Technique & Structure", IBM Tech. Discl. Bulletin, vol. 16, No. 4, Bogardus et al.
"Gettering of Impurities by Intentional Double Diffusion", Leighton et al., IBM Technical Disclosure Bulletin, vol. 22, No. 8A, Jan. 1980.
"Self-Aligned Submicron Bipolar Transistor Process", Horng et al., IBM Technical Disclosure Bulletin, vol. 23, No. 7B, Dec. 1980.
"Process for Yield Improvement in Biopolar Devices", Barson et al. IBM Technical Disclosure Bulletin, vol. 23, No. 1, Jun. 1980.
"Simultaneous Formation of High Sheet Resistance Ion-Implanted—Resistors and Impurity Gettering for Bipolar Transistors", Putney IBM Technical Disclosure Bulletin, vol. 20, No. 10, Mar. 1978.
"Enhancement of Lateral P—N—P Current Gain by Gettering", Kesavan, et al., J. Electrochem. Soc. vol. 126, No. 4, pp. 642–644. Apr. 1979.
"Noise in Integrated Circuits", Chapter 11, pp. 607–636.
"Internal Gettering in Bipolar Process", Jastrzebski et al., J. Electrochem. Soc., Dec. 1984, pp. 2944–2953.
"Control of Stacking Fault Generation in Recessed Oxide Processing", Geipel, et al., IBM Technical Disclosure Bulletin vol. 21, No. 4, 9/78.

*Primary Examiner*—Robert S. Macon
*Attorney, Agent, or Firm*—Cahill, Sutton & Thomas

[57] ABSTRACT

Large "inactive" N+ regions are provided in P channel junction field effect transistors (JFETs) or NPN transistors immediately adjacent to "active" areas thereof to getter impurities away from the active areas. The ratio of inactive N+ area to the total area of the transistors is selected to provide suitably low noise measurements at low frequencies. Low noise amplifier circuitry is provided wherein all transistors in the AC signal path include unusually large ratios of inactive N+ area to total transistor area in order to provide greatly reduced low frequency noise levels.

16 Claims, 4 Drawing Sheets

FRONT-SURFACE N+ GETTERING TECHNIQUES FOR REDUCING NOISE IN INTEGRATED CIRCUITS

BACKGROUND OF THE INVENTION

The invention relates to techniques and structures for front-surface gettering of impurities in integrated circuits.

It should be noted that the precise mechanisms involved in gettering are not well understood, and numerous technical articles have been written directed to this subject setting forth various, sometimes inconsistent, theories.

So-called "gettering" techniques introduce low energy sites into a semiconductor crystal lattice structure so that at high temperatures, various fast diffusing impurities, especially heavy metallic impurities such as copper, iron, and gold will be trapped. It is highly desirable in semiconductor devices to trap such heavy metallic impurities in locations remote from the "active" regions of semiconductor devices because otherwise such metallic impurities represent minority carrier sites that result in frequent generation and recombination of minority carriers in the active regions. Such generation and recombination of minority carriers in active regions of a transistor produces noise in currents flowing through the transistor. Such noise includes the type sometimes referred to as "popcorn" noise or "burst" noise, and also includes 1/f noise, both of which ae highly undesirable in semiconductor devices such as JFETs and NPN transistors, etc. that are used in high gain, low noise amplifier circuits. Various techniques have been proposed or utilized for gettering unwanted impurities from semiconductors. Such techniques have included introducing highly stressed or damaged regions in the semiconductor single crystal lattice structure by diffusing or implanting ions into front and/or back surfaces of integrated circuit wafers. Such damage produces low energy sites in the semiconductor lattice structure that act as traps for fast diffusing metallic impurities when the semiconductor wafer temperature is elevated to appropriate gettering temperatures.

Perhaps the closest prior art is indicated by U.S. Pat. No. 3,874,936 and by "Gettering Technique and Structure", by Bogardus, et al., IBM Technical Disclosure Bulletin Vol. 16, No. 4, September, 1983, page 1066. U.S. Pat. No. 3,874,936 discloses creating top surface stressed areas on a semiconductor wafer by providing boron diffusions within both N+ emitter regions and N+ collector contact regions in NPN transistors. The Bogardus disclosure shows the technique of creating highly damaged ring-shaped regions in the base and collector regions of NPN transistors to provide top surface gettering of impurities in an integrated circuit structure. The disclosed techniques require steps additional to those of standard integrated circuit processes, adding considerably to the cost of manufacture of the integrated circuits. The above references teach that the gettering achieved reduces the occurrence of "soft" PN junctions and increases yields. The references do not teach that use of front-surface gettering of any kind is practical as a means of reducing the noise of bipolar transistors, field effect transistors, or integrated circuits containing such devices.

It is thought that the prior art includes bipolar transistor devices in which N+ rings have been utilized in the collector region for the purpose of reducing series collector resistance. It also is believed that the prior art includes NPN transistor structures in which N+ rings have been formed within the base region and electrically shorted thereto for the purpose of reducing minority carrier storage time to increase transistor switching speeds.

There is an unmet need for an improved technique of substantially reducing the noise produced in integrated circuits manufactured by conventional integrated circuit manufacturing processes without substantially increasing the number of processing steps or the cost of the overall manufacturing process. For example, the assignee has experienced yield losses of two to five percent of certain low noise operational amplifier circuits and the like due to failure to pass low frequency noise tests.

SUMMARY OF THE INVENTION

It is an object of the invention to provide a technique for reducing the amount of low frequency noise in a semiconductor device.

It is another object of the invention to provide a gettering technique for reducing low frequency noise in bipolar transistors and field effect transistors without significantly increasing the cost of integrated circuits containing them.

Briefly described, and in accordance with one embodiment thereof, the invention provides a low noise semiconductor device, such as a junction field effect transistor (JFET) of bipolar transistor, including features for reducing noise in the semiconductor device by providing a plurality of regions in a top surface of the semiconductor device within a first region, some of the regions defining an active region in which current flows to cause the semiconductor to operate and in which recombination-generation centers including heavy metallic impurities exist, the semiconductor device including a gettering region of inactive, heavily doped material in an area of the top surface that lies outside of an adjacent to the active region, wherein the gettering region occupies at least about 25 percent of the top surface area of the first region. In some of the the described embodiments of the invention, the inactive, heavily doped gettering region occupies as much as about 75 percent of the top surface area of the first region. In the described embodiments of the invention, the gettering region is filled with N+ impurities which are introduced into the top surface during the same process in which N+ emitter region impurities are introduced into other areas of the surface. In one described embodiment of the invention, relatively large N+ gettering regions are formed adjacent to and/or surrounding the channel region of a P channel junction field effect transistor in an integrated circuit structure. In another embodiment of the invention, an N+ gettering regions surrounds the emitter-base junction of a NPN transistor in an integrated circuit structure and is disposed within the base region thereof, and another larger N+ gettering region is disposed in the N type epitaxial N type island in which the base region is formed. Suitable temperature ramping cycles are provided to allow fast diffusing metallic impurities in the vicinity of the active region of the semiconductor device to diffuse to the N+ gettering regions, reducing the concentration of such metallic impurities in the active region of the semiconductor device, thereby reducing noise due to recombination-generation of minority carriers in the active regions of semiconductor devices such as NPN transistors and P channel JFETs.

A high gain, low noise amplifier is described in which all transistors in the AC signal path from the input through the high gain portion of the amplifier contain N+ gettering regions adjacent to their active regions, wherein each of the N+ gettering regions occupies from about 25 percent to about 75 percent of the surface area of the N type region in which the transistor is formed. A substantial decrease in the total noise voltage in the circuit is achieved, due to an even greater reduction in the low frequency noise component therein.

DETAILED DESCRIPTION OF THE INVENTION

Figure 1A:
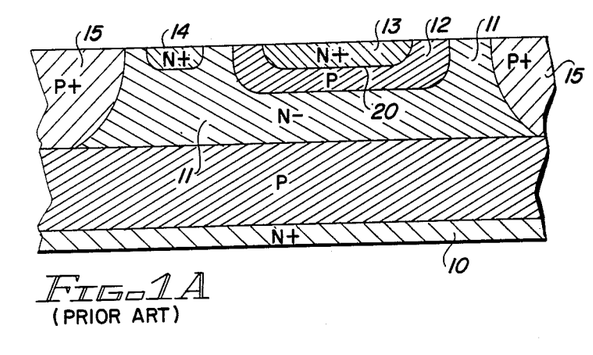
FIG. 1A is a section view of a conventional NPN transistor.
Figure 1B:
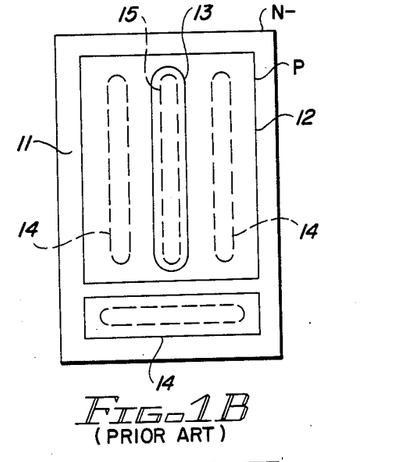
FIG. 1B is a plan view of the prior art transistor shown in FIG. 1.

Before describing the several embodiments of the invention, it first will be helpful to describe a conventional integrated circuit NPN transistor and a conventional integrated circuit P channel JFET. Referring to FIGS. 1A and 1B, a typical bipolar integrated circuit structure is shown. A lightly doped N type region 11 disposed on a P type substrate is isolated from other such lightly doped N type regions (not shown) by a deep P+ isolation diffusion 15. A P type base region 12 is diffused into the N region 11. Subsequently, N+ emitter region 13 and N+ collector contact regions 14 are diffused into base region 12 and N− "collector" region 11, respectively. In some processes, an N+ gettering layer 10 is formed on the bottom of the P type substrate to getter impurities, to reduce low frequency noise. This, of course, cannot be done for dielectrically isolated integrated circuits.

Figure 1C:
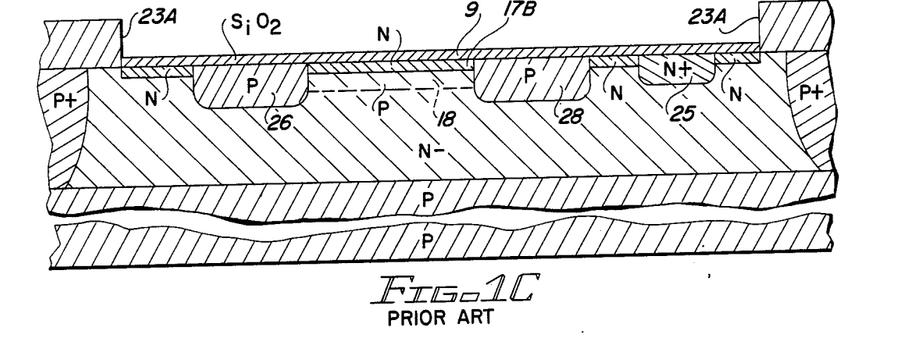
FIG. 1C is a section view of a conventional JFET (junction field effect transistor).
Figure 1D:
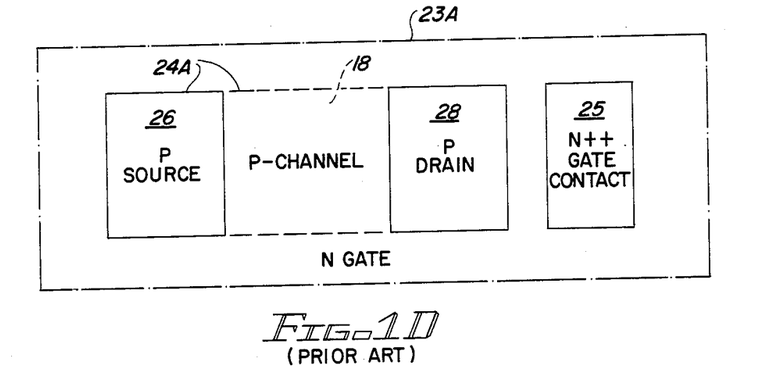
FIG. 1D is a partial plan view of the JFET of FIG. 1C.

In FIGS. 1C and 1D, a conventional prior art P channel JFET of the type commonly included with NPN bipolar transistors in an integrated circuit manufacturing process is illustrated. The P channel JFET is formed within an N− epitaxial region 17A. The source region 26 and drain region 28 are formed at the same time that the base regions of NPN transistors elsewhere in the circuit are formed. An N+ gate contact region 25 is formed outside of the channel region between source and drain regions 26 and 28 at the same time that the emitter regions are formed elsewhere in the circuit. Then a gate mask opening 23A is formed in the thick field oxide on the upper surface of the circuit, and a thin oxide layer 9 is formed to improve the quality of a subsequent N type gate implanting operation.

Next, a photoresist mask is applied to the upper surface to leave only a channel region 24A exposed, and a boron channel implanting operation is performed to produce a lightly doped P− channel region 18 between the source and the drain. (Typically, the concentration of the channel might be $5 \times 10^{16}$ to $7 \times 10^{16}$ atoms per cubic centimeter.) The channel mask of photoresist then is removed, and an arsenic implant step is performed to produce an N type gate region 18 within gate opening 23A. (The concentration of the arsenic doped gate layer might be from about $1 \times 10^{17}$ to $5 \times 10^{17}$ atoms per cubic centimeter. This is not high enough to compensate the surface of the P type source and drain regions 26 and 28.) The arsenic doped layer 17B forms the top gate electrode of the JFET, the bottom gate electrode being formed by the N− epitaxial region 17A. (The P− channel region 18 is pinched off in the proportion to the voltage applied to gate contact region 25 relative to the voltage applied to the source region 16A.)

By way of definition, in the NPN transistor of FIGS. 1A and 1B, the "active" region is considered to include the emitter-base junction and regions immediately adjacent thereto, wherein minority carriers are injected by the emitter into the base to form the collector current. The presence of recombination-generation centers in this active region leads to the above-described low frequency "popcorn" noise and 1/f noise in the collector current, which is highly undesirable for low noise circuits. In the JFET of FIGS. 1C and 1D, the "active" region in the P− channel region 18. Presence of recombination-generation centers in the channel region causes low frequency 1/f noise in the drain current, which also is undesirable for low noise circuits.

Although the N+ collector contact region 14 and the emitter region 13 of the conventional bipolar transistor of FIGS. 1A and 1B inherently getter fast diffusing metallic impurities during certain portions of conventional integrated circuit manufacturing processes, the concentration of such metallic impurities in the active regions clearly is not adequate to prevent substantial yield losses in low noise integrated circuits. Similarly, the N+ gate contact region 25 in the JFETs of FIGS. 1C and 1D getters some of the heavy metallic impurities in the channel region, but not nearly enough to reduce the noise level in low noise circuits sufficiently to avoid substantial yield losses. It is believed that the N+ emitter regions, collector contact regions, and N+ gate contact regions tend to attract fast diffusing metallic impurities into the active regions of such transistors. The N+ regions such as 10 in FIG. 1A on the bottom surface of wafers have been inadequate to reduce the concentration of heavy metallic impurities in the active regions of the transistors enough to reduce low frequency noise to acceptably low levels.

Now that the basic JFET and NPN transistor structures of conventional integrated circuit manufacturing processes are well understood, the experiments leading to the present invention can be easily understood. In accordance with the present invention, experiments were performed to determine if substantial improvements in yield of certain low noise integrated circuits could be achieved by "front surface gettering". Substantial amounts of additional heavily damaged, electrically "inactive" emitter-type N+ areas were provided in the N− epitaxial regions of JFETs and bipolar transistors but outside of the active regions thereof to determine if enough metallic impurities could be gettered away from the active regions to substantially reduce low frequency noise therein.

Figures 2A, 3B:
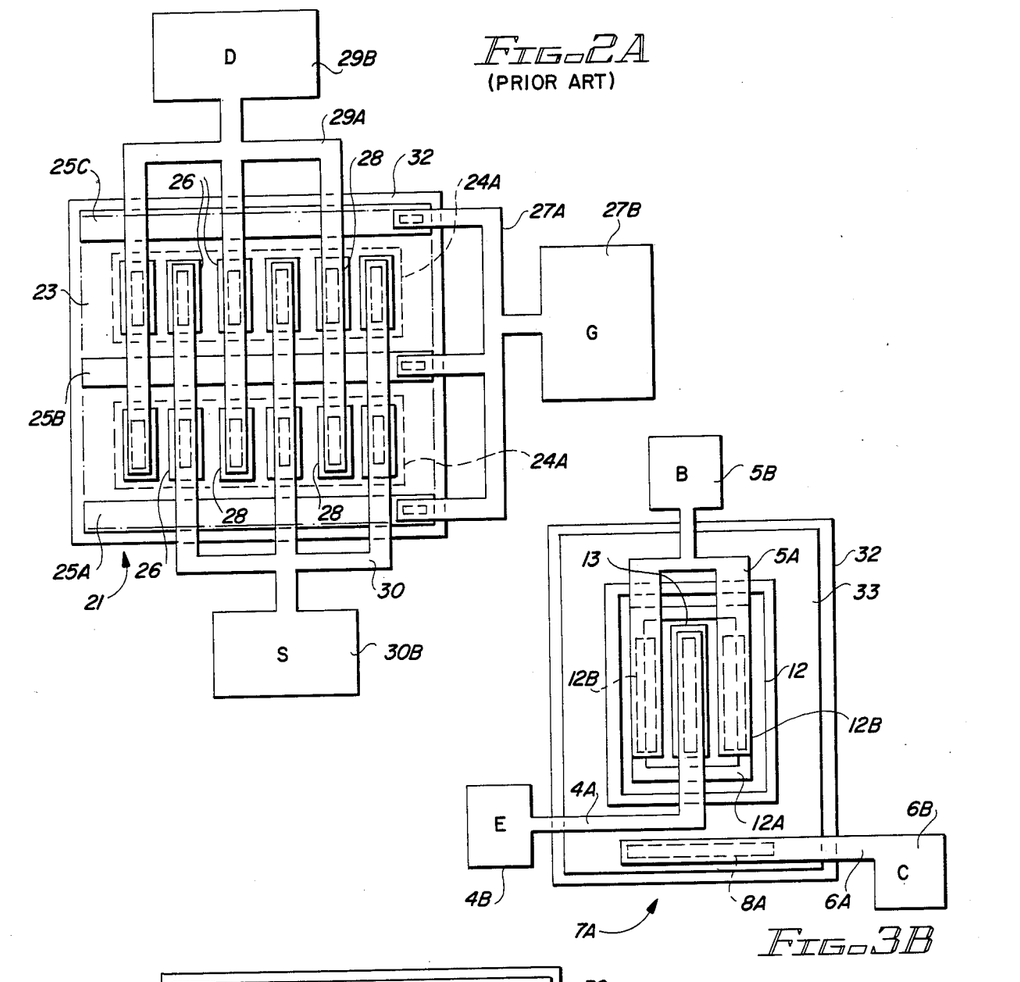
FIG. 2A is a plan view of a standard JFET utilized in experiments leading to the present invention.
FIG. 3B is a plan view of an NPN integrated circuit transistor containing a large N+ gettering region in accordance with the present invention.
Figure 2B:
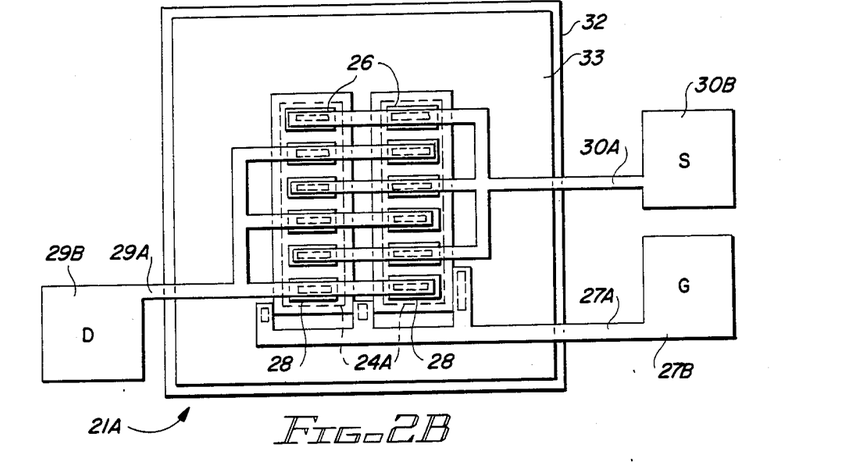
FIG. 2B is a plan view of an N+ enhanced JFET similar to that of FIG. 2A and having a large inactive N+ gettering region in accordance with the present invention.

To perform the experiments, a pair of JFET devices 21 and 21A shown in FIGS. 2A and 2B, respectively, were constructed. The JFET 21 in FIG. 2A is referred to hereafter as a "standard" JFET and JFET 21A is referred to herein as an "N+ enhanced JFET". Both standard JFET 21 and N+ enhanced JFET 21A are formed in a respective dielectrically isolated N− epitaxial region designated by reference numeral 32. (However, for N+ enhanced JFET 21A, the top surface area of the N type epitaxial region 32 is substantially larger than that of standard JFET 21.) Both standard JFET 21 and N+ enhanced JFET 21A have a plurality of separate P type source regions 28, all of which are electrically connected together by a metal conductor 30A that is also connected to a source electrode 30B. (The reason that separate source regions are utilized rather than a single long source region, is to make "scaling" of the geometry of the JFET more convenient.)

Both standard JFET 21 and N+ enhanced JFET 21A include a plurality of separate P type drain regions 28, all of which are electrically connected together by a metal conductor 29A that also is connected to a drain electrode 29B. (The contact openings of conductors 29A to the P type drain regions 28 and the contact openings allowing connection of the source regions 26 to metal conductor 30A are indicated by dotted lines.) In both JFETs 21 and 21A, the N type gate region is designated by reference numeral 23, and P type channel regions are designated by reference numeral 24A. The N+ gate contact regions 25A, 25B, and 25C all are connected by metal conductor 27A to a gate electrode 27B.

The only difference between standard JFET 21 and N+ enhanced JFET 21A is the increased size of the epitaxial N type region 32 and the provision of a large N+ gettering ring 33 in N+ enhanced JFET 21A. Gettering ring 33 is formed of the same N+ material as gate contact regions 25A, 25B, and 25C, and extends as closely as permissable (i.e., about 0.2 mils) according to good design practice to the edge of the epitaxial N−¹ region 32.

In accordance with the present invention, the area of N+ gettering region 33 is about 25 to 75 percent of the total area of the epitaxial N− region 32, and preferably is about 50 percent thereof. More specifically, in the standard JFET of FIG. 2A, the total area of epitaxial N− type region 32 is 63.84 square mils, and the total inactive N+ area is 14.4. square mils, producing a 23 percent ratio of inactive N+ area to total epitaxial N− area. For the N+ enhanced JFET shown in FIG. 2B, the total epitaxial N− area is 165.06 square mils, and the total inactive N+ area is 115.52 square mils, so the ratio of inactive N+ area to total epitaxial area is 70 percent.

Using identical processing procedures, a number of samples of each of JFETs 21 and 21A were fabricated and then tested for low noise performance with drain currents of 200 microamperes. (Drain currents of 200 microamperes were selected so that the recombination-generation components of the noise would not be dwarfed by the so-called $g_m$ noise.)

The noise voltage measurements of each JFET were made at frequencies of 10 hertz, 100 hertz, 1 kilohertz, 10 kilohertz, and 100 kilohertz, utilizing a Quan-Tec transistor noise analyzer Model 2173C, manufactured by Quan-Tec, a division of KMS Industries, Flander, N.J.

Although very little difference was found in the noise voltage measurements of JFETs 21 and 21A at frequencies above 1 kilohertz, at lower frequencies the noise voltage measurements of N+ enhanced JFETs, such as 21A were significantly lower. For a sample of 30 devices, half of which were identical to standard JFET 21 and the other half of which were identical to N+ enhanced JFET 21A, the mean measured noise voltage at 10 hertz was 12.33 nanovolts for standard JFET 21, with a standard deviation of 1.68 nanovolts. The mean noise voltage measured at 10 hertz for N+ enhanced JFET 21A was much lower, at 9.53 nanovolts, with a standard deviation of 1.58 nanovolts. This indicates a 23 percent reduction in total measured noise at 10 hertz achieved by providing the large amount of inactive N+ area 33 immediately adjacent to the active region (i.e., the channel region 18) of N+ enhanced JFET 21A.

At 100 hertz, the mean measured noise voltage for the standard JFETs 21 was 10.30 nanovolts, with a standard deviation of 0.775. The mean measured voltage for the N+ enhanced JFETs 21A again was much lower, at 8.60 nanovolts, with a standard deviation of 8.28.

For noise voltage measurements at 1 kilohertz, the mean measured noise for the standard JFETs 21 was 5.39 nanovolts with a standard deviation of 0.21 nanovolts. The mean measured noise for the N+ enhanced JFETs 21A was only slightly lower, at 5.22 nanovolts, with a standard deviation of 0.20 nanovolts.

Although a slight difference in the mean measured noise voltages was found to exist at 1 kilohertz, the difference is not nearly as great as the difference between the standard and N+ enhanced JFETs at the lower frequencies. This result is consistent with the fact that noise due to minority carrier generation-recombination mechanisms (which is what is caused by metallic impurities such as iron, copper, etc. in the semiconductor material) is present mainly at the lower frequencies. If sufficiently increased amounts of the metallic impurities actually are gettered to the inactive N+ gettering region 33 of N+ enhanced JFET 21A, this would cause its low frequency noise voltage to be substantially less than that of standard JFET 21, which is what is observed above.

Figure 4A:
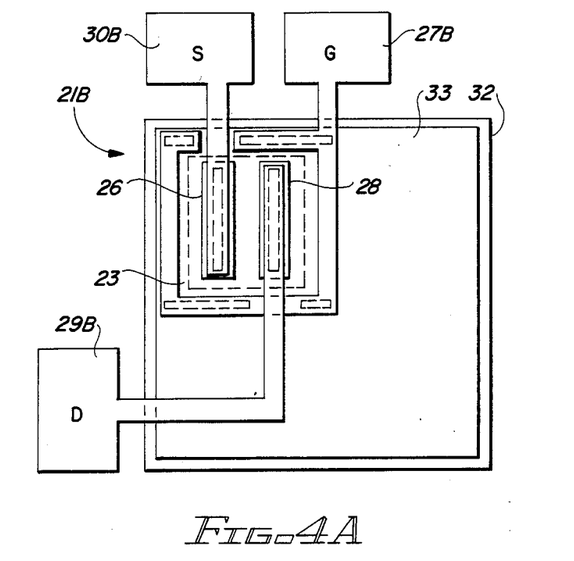
FIG. 4A is a plan view of another junction field effect transistor structure having a large ratio of inactive N+ region to total transistor area in accordance with the present invention.
Figure 4B:
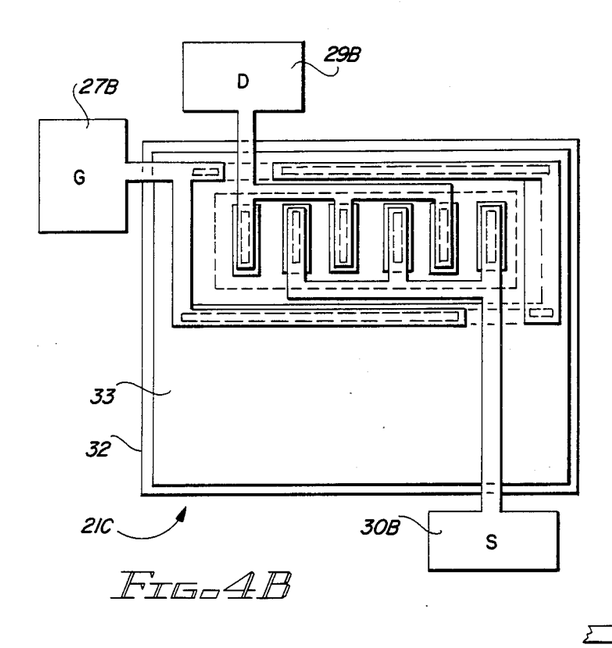
FIG. 4B is a plan view of another junction field effect transistor having a relatively large inactive N+ gettering region.
Figure 5:
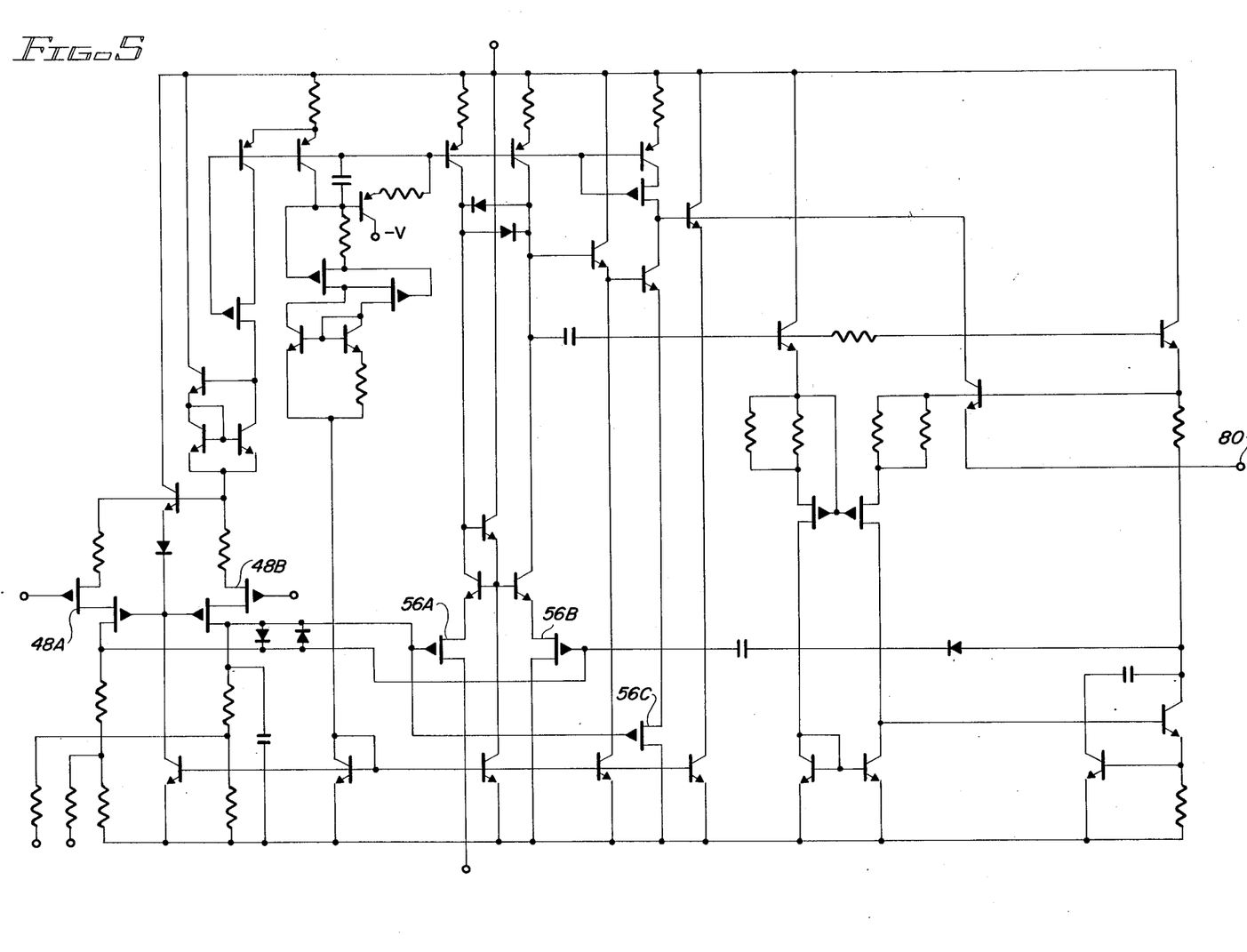
FIG. 5 is a schematic diagram of a low noise amplifier including the N+ enhanced junction field effect transistors shown in FIGS. 4A and 4B in the high gain portion of the AC signal path.

FIG. 5 shows a low noise operational amplifier circuit including JFETs 48A, 48B, 56A, 56B, and 56C in the AC signal path in the high gain sections of the circuit in which low frequency noise would be most damaging to overall noise performance of the amplifier. JFETs 48A and 48B were implemented using a JFET structure essentially similar to the enhanced N+ JFET structure 21B shown in FIG. 4A. The various parts of N+ enhanced JFET 21B are designated by the same reference numerals as in FIG. 2B. JFETs 56A, 56B, and 56C are implemented by means of N+ enhanced JFET 21C in FIG. 4B, wherein the various elements are designated by the same reference numerals as in FIG. 2B. (Due to the location of available area in a preexisting mask set for the operational amplifier of FIG. 5, the large N+ gettering regions 33 in input transistors 21B of FIG. 4A and JFET 21C of FIG. 4B are not in the form of rings symmetrically surrounding the active channel regions. Instead, the N+ gettering regions 33 are along side of the active channel area as shown.) Note that the precise configuration of the various components in FIG. 5 is not relevant to the invention. Those skilled in the art can easily recognize the high gain signal path and the functions of the various bias circuits, differential stages, and output stage of the operational amplifier, so they are not described in detail.

After the preexisting mask set was altered to provide the above JFET structures, a wafer run was fabricated in which half of the wafers in the lot utilized the original JFET structure without the N+ gettering regions 33. The other half of the wafers were manufactured using mask sets that do produce the N+ gettering regions 33 as described above.

After processing, all of the wafers were tested for noise voltage readings at 10 hertz. The 10 hertz noise voltage measured at the output conductor 80 of the amplifier circuit shown in FIG. 5 for the circuits having standard JFETs was 59.46 nanovolts. The average noise voltage meaured in those circuits of the same processing run manufactured with N+ enhanced JFETs of FIGS. 4A and 4B was only 36.7 nanovolts.

The results of the foregoing experiments for the circuit of FIG. 5 indicate that in low noise circuits, use of transistors (either JFETs or bipolar transistors) with N+ gettering regions that occupy from about 25 percent to about 75 percent of the epitaxial N type region (in which the JFET or bipolar transistor is fabricated) to implement all transistors in the AC signal path through the input stage and any successive high gain stages should substantially reduce low frequency noise.

Figure 6A:
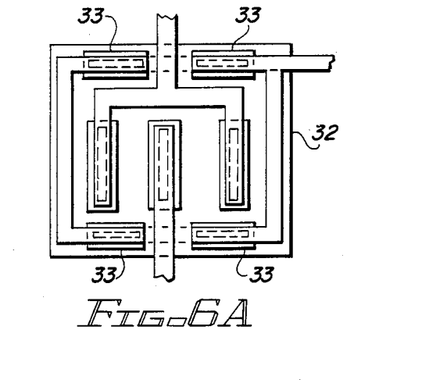
FIGS. 6A and 6B are plan views of junction field effect transistors with different ratios of inactive N+ gettering area to total transistor area, used in experiments leading to the present invention.

The JFET 21B of FIG. 4A has 78 percent of the surface area of the epitaxial N type region 32 filled with N+ gettering region 33. JFET 21D of FIG. 6A has 22 percent of the surface of its N type epitaxial region 32 filled with N+ gettering region 33. JFET 21E of FIG. 6B has only 6.6 percent of its N type epitaxial region 33 filled with N+ region 33.

Figure 6B:
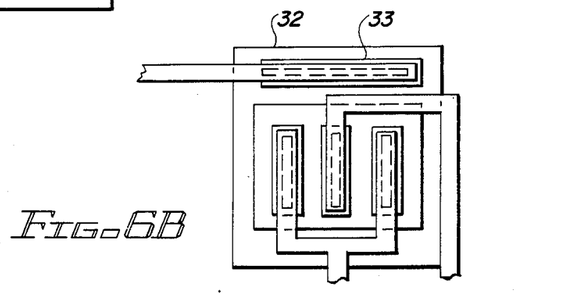

Using JFETs 21B, 21D, and 21E all of which were fabricated in the same wafer run, another experiment was performed in which noise measurements at drain currents of 200 microamperes were measured at 10 hertz, 100 hertz and 1 kilohertz. The mean noise voltages measured for the JFETs 21B of FIG. 4A, 21D of FIG. 6A, and 21E of FIG. 6B are indicated in the following table:

TABLE 1

| FREQUENCY | JFET 21B (78% INACTIVE N+) | JFET 21D (22% INACTIVE N+) | JFET 21E (6.6% INACTIVE N+) |
|---|---|---|---|
| 10 hertz | 21.33 nanovolts | 26.0 nanovolts | 39.83 nanovolts |
| 100 hertz | 37.5 nanovolts | 42.67 nanovolts | 47.67 nanovolts |
| 1 kHz | 12.0 nanovolts | 12.0 nanovolts | 14.08 nanovolts |

The above figures show that at low frequencies, the noise voltage is a strong function of the ratio of the inactive N+ gettering region area to the total surface area of the N type epitaxial region of the transistor, and that at least about 20 to 25 percent of the N type epitaxial region (in which the transistor is formed) should be filled with inactive emitter diffusion type N+ material that has a heavily damaged surface structure.

Figure 3A:
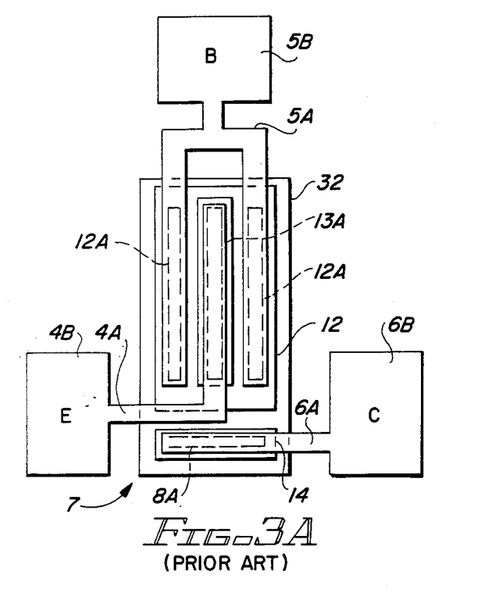
FIG. 3A is a plan view of a conventional NPN integrated circuit transistor used in experiments leading in the present invention.

Although most of the experiments performed were with P channel JFETs as described above, a similar analysis has been performed for bipolar NPN transistors. FIG. 3A shows a standard NPN transistor 7, having basically the structure shown in FIGS. 1A and 1B. FIG. 3B shows another NPN transistor that is referred to herein as N+ enhanced NPN transistor 7A. Its base, emitter, and base contact regions are essentially identical, except that the structure in FIG. 3B has a substantially larger epitaxial N type region 32 and an N+ gettering ring 33 formed around it similar to the gettering rings described above for the JFET devices, and also has an N+ gettering ring 12A formed in the P type base regin 12 and electrically shorted to the base region 12 by metal 5A through the enlarged base contact openings 12B.

The percentage of the surface area of the epitaxial N type region 32 for standard NPN transistor 7 that is occupied by inactive N+ material constituting the N+ collector contact region 14 is about 7 percent. In the N+ enhanced NPN transistor 7A of FIG. 3B, the percentage of the surface of epitaxial of N type region 32 occupied by N+ gettering region 33 should be at least about 20 to 40 percent.

It should be noted that the device shown in FIG. 3B has not actually been constructed and tested yet. Instead, a similar device having a narrower N+ ring structure for N+ region 33, in which inactive N+ material occupies only about 35 percent of the epitaxial N type region 33, was constructed and tested. That device and the device shown in FIG. 3A were fabricated in the same wafer run and subjected to noise voltage tests at 10 hertz, 100 hertz, and 1 kilohertz, and produced the following results:

TABLE 2

| FREQUENCY | STANDARD NPN TRANSISTOR (7 MEAN NOISE VOLTAGE) | N+ ENHANCED NPN TRANSISTOR 7A |
|---|---|---|
| 10 hertz | 3.20 nanovolts | 2.97 nanovolts |
| 100 hertz | 4.73 nanovolts | 4.18 nanovolts |
| 1 kHz | 3.18 nanovolts | 2.91 nanovolts |

Although the reduction in measured noise voltage as a result of providing the N+ rings in the collector and base regions is not as pronounced as in the JFETs, the ratio of inactive N+ gettering region area to total NPN transistor area in those experiments is not as large as would be desirable. Further experiments need to be performed with larger ratios of N+ gettering region area to N type epitaxial region area to determine what the optimum ratio should be.

It should be noted that the above-mentioned Quan-Tec noise analyzer measures noise voltage. In bipolar transistors, the noise current is also important. The noise current can be computed from the noise voltage by placing a resistor in series with the base electrode of a transistor and taking measurements again using the Quan-Tec noise analyzer. The following equations provide a brief review of how this can be accomplished. The basic noise equation is:

$$e_n^2 = \frac{I_C}{\beta}\left(2q + \frac{K}{F}\right)r_b^2 + 4kTr_b + 2q\frac{V_T^2}{I_C}$$

where
- $I_C$ = collector current
- $\beta$ = hfo
- $q = 1.6 \times 10^{-19}$
- $K$ = flicker coefficient (due to recombination and generation of popcorn noise)
- $V_T$ = thermal voltage 0.0259
- $f$ = frequency
- $r_b$ = base resistance
- $e_n$ = measured noise voltage At high frequencies, $$\frac{K}{F} \to 0.$$

Therefore:

$$e_n^2 = \frac{I_C}{\beta} 2q\, r_b^2 + 4KTr_b + 2q\frac{V_T^2}{I_C}.$$

This equation can now be solved for $r_b$:

$$r_b = \frac{-(4KT) + \sqrt{(4KT)^2 - (4)\left(\frac{2qI_C}{\beta}\right)\left(2q\frac{V_T^2}{I_C} - e_n^2\right)}}{2\left(\frac{2qI_C}{\beta}\right)}.$$

Once $r_b$ is known, then measurements made with a resistance $R_s$ in series with the base can be used to calculate K at low frequencies.

The following equation applies when $R_s$ is connected in series with the base electrode:

$$e_{ns}^2 = \frac{I_C}{\beta}\left(2q + \frac{K}{f}\right)(r_b + R_s)^2 + 4KT(r_b + R_s) + 2q\frac{V_T^2}{I_C},$$

where $e_{ns}$ = noise measured with $R_s$ in series with the base.

Rather than solve these equations by hand, a simple program was written to perform the calculations. The results of these measurements and calculations are presented below.

| | Standard NPN Transistor 7 of FIG. 3A | N+ Enhanced NPN Transistor With Minimum Width N+ Rings in Base Region and Collector Region |
|---|---|---|
| Avg. $e_n$(100 KhZ) | 2.89 nanovolts | 2.51 nanovolts |
| Avg. $e_{ns}$(10 Hz) | 19.79 nanovolts | 15.57 nanovolts |
| $\beta$ | 680 | 650 |
| $I_C$ | 200 microamperes | 200 microamperes |
| $r_b$ | 437.4 ohms | 313.3 ohms |
| K | $5.26 \times 10^{-17}$ | $1.82 \times 10^{-17}$ |

It can be seen that for the N+ enhanced devices, the flicker coefficient of noise has been substantially reduced.

Finally, the noise current can be calculated using the equation:

$$\overline{i_n}^2 = \left(2q + \frac{K}{f}\right)\frac{I_C}{\beta}.$$

The results are:

| Noise Current | Standard NPN Transistor 7 of FIG. 3A | NPN Transistor With Minimum Width N+ Rings in Base Region and Collector Region |
|---|---|---|
| $i_n$ | 1.27 picoamps | .81 picoamps |

Again, the noise current has been reduced by about 36 percent.

The above equations appear in various text books that discuss noise in semiconductor devices. For example, see the text "Analysis and Design of Integrated Circuits" by Gray and Meyer, 1977, published by John Wiley & Sons, Inc.

Those skilled in the art will appreciate that a decrease in the total measured noise voltage at low frequency, i.e., 10 hertz or 100 hertz, actually corresponds to a much larger percentage decrease in the low frequency noise voltage, since the low frequency component of the total noise voltage is much less than the total noise voltage itself, and since the remaining high frequency components of the total measured noise voltage are not significantly influenced by recombination-generation mechanisms and therefore are not affected by provision of the large N+ gettering regions adjacent to the active regions of the JFETs or bipolar transistors.

It should be noted that various temperature ramping cycles can be provided to optimize the gettering by the N+ gettering regions 33 in the NPN transistors and JFETs described above. Once gettering has occurred, the trapped metallic impurities will remain trapped unless the temperature of the wafer is raised to a sufficiently high level. For the devices described above, I believe that gettering has occurred mainly during a gradual, 70 minute linear decline in the temperature from 900° Centigrade to 650° Centigrade in the presence of nitrogen, after a 900° Centigrade annealing step performed after implanting the top gate region with arsenic ions.

It should be noted that the reduction in noise voltage of the JFETs and bipolar transistors as a function of increasing ratios of inactive N+ gettering region area to epitaxial N type region surface area diminishes as the ratio increases. For particular applications, the circuit designer will have to make a tradeoff between the amount of increase in overall size of the integrated circuit and the amount of reduction in noise voltage achieved thereby.

It is believed to be a surprising result that substantial improvements in total measured noise voltage of a JFET, bipolar transistor, or low noise circuit utilizing such JFETs or transistors in the high gain signal path can be achieved without substantially increasing the overall size of the integrated chip.

While the invention has been described with respect to a number of embodiments, those skilled in the art will be able to make various modifications to the described embodiment without departing from the true spirit and scope of the invention. It is intended that all structures and techniques which are equivalent to those described herein in that they perform substantially the same function in substantially the same way to achieve the same result are within the scope of the invention.

I claim:

1. A method of reducing noise in a semiconductor device, comprising the steps of:
   (a) providing a first region in a top surface of a semiconductor wafer and providing a plurality of regions within the first region, some of the regions defining an electrically active region in which current flows to cause the semiconductor device to operate; and
   (b) forming a gettering region of heavily doped, electrically inactive material in the top surface and located outside of and adjacent to the electrically active region of the semiconductor device by producing a high concentration of surface damage in the semiconductor crystal lattice in the top surface, the gettering region occupying at least about 25 percent of the top surface area of the first region.

2. The method of claim 1 including forming the gettering region in a configuration that substantially surrounds the electrically active region of the semiconductor device.

3. The method of claim 1 including forming the high concentration of surface damage by forming an N+ region that comprises a first N+ gettering region.

4. The method of claim 3 including producing the first N+ gettering region simultaneously with the step of forming N+ emitter regions elsewhere in a semiconductor wafer in which the semiconductor device is being formed.

5. The method of claim 4 including producing the gettering region to occupy a percentage of the top surface area of the first region in the range from 25 to 75 percent.

6. The method of claim 5 wherein the step (a) includes forming an electrically isolated N type epitaxial region comprising the first region and forming a P type base region in the N type epitaxial region, and wherein the method includes forming an N+ emitter region in the P type base region and simultaneously forming the N+ region that comprises the first N+ gettering region in the N type epitaxial region in spaced relationship to the P type base region, to thereby form a low noise bipolar transistor.

7. The method of claim 6 including forming an N+ region that comprises a second N+ gettering region in the P type base region in spaced relationship to the N+ emitter region simultaneously with the forming of the N+ emitter region, and electrically shorting the second N+ gettering region to the P type base region.

8. The method of claim 5 wherein step (a) includes forming an electrically isolated N type epitaxial region comprising the first region and forming a P type soure region and a P type drain region in the N type epitaxial region, and wherein the method includes forming an N+ gate contact region in the N type epitaxial region in spaced relationship to the source region and the drain region and simultaneously forming the N+ region that comprises the first N+ gettering region in the N type epitaxial region in spaced relationship to the source and drain regions, to form a low noise field effect transistor.

9. The method of claim 5 including heating the semiconductor wafer to a first temperature that is low enough to prevent appreciable diffusion of doping impurities in the first region and the plurality of regions and is high enough to allow rapid diffusion of fast diffusing metallic impurities to effectuate sufficiently rapid diffusion of metallic impurities in the vicinity of the electrically active region to the first N+ gettering region and gradually ramping the temperature down to a second temperature at which diffusion of the metallic impurities is insignificant, so as to substantially deplete the metallic impurities from the vicinity of the electrically active region, to thereby avoid minority carrier recombination-generation at metallic impurities in the electrically active region.

10. The method of claim 9 wherein the first temperature is about 900° Centigrade, the second temperature is about 650° Centigrade, and the duration of the ramping is about one hour.

11. A low noise semiconductor device including:
    (a) a semiconductor wafer having a top surface and an electrically isolated first region therein;
    (b) a plurality of regions disposed within the first region at the top surface, the plurality of regions defining an electrically active region in which a current flows to cause the semiconductor device to operate, fast diffusing metallic impurities in the semiconductor wafer in the vicinity of the electrically active region causing minority carrier recombination and generation to produce low frequency noise in the current;
    (c) a gettering region of heavily doped, electrically inactive material comprised of a high concentration of surface damage in the semiconductor crystal lattice and disposed in the first region at the top surface in closely spaced relationship to the electrically active region, the gettering region occupying about 25 to 75 percent of the top surface area of the first region and trapping a sufficient number of metallic impurities originally in the vicinity of the electrically active region such that low frequency noise in the current is substantially reduced when the semiconductor device is operated.

12. The low noise semiconductor device of claim 11 wherein the first region is an N type epitaxial region having therein a P type source region and a P type drain region, the electrically active region including a lightly doped P type channel region, and an N+ gate contact region located in spaced relationship to the source and drain regions and the channel region, the N+ gate contact region having the same doping type and same doping profile as the gettering region,
    whereby the low noise semiconductor device is comprised of a junction field effect transistor.

13. The low noise semiconductor device of claim 11 wherein the gettering region substantially surrounds the plurality of regions in the first region.

14. The low noise semiconductor device of claim 11 wherein the first region is an N type epitaxial region having therein a P type base region and an N+ type emitter region disposed in the base region, the electrically active region including the emitter base junction formed thereby, the N+ emitter region having the same doping type and same doping profiles as the gettering region,
    whereby the low noise semiconductor device is comprised of an NPN transistor.

15. The low noise semiconductor of claim 12 or 14 wherein the gettering region includes phosphorous atoms having a surface concentration of about $10^{21}$ atoms per cubic centimeter.

16. A low noise amplifying circuit formed in a semiconductor wafer and having a top surface and having an input terminal receiving an output signal and an output terminal, comprising:
    (a) amplifying circuit means coupled between the input conductor and the output conductor for amplifying the input signal to produce an amplified output signal on the output conductor; and
    (b) a plurality of active semiconductor devices interconnected in the amplifying circuit means to form an AC signal path between the input conductor and the output conductor, some of active devices substantially amplifying the input signal,
    wherein each of the active devices that substantially amplifies the input signal includes an electrically isolated first region in the semiconductor wafer, a plurality of regions disposed within the first region at the top surface, the plurality of regions defining an electrically active region in which a current flows to cause the semiconductor device to operate, fast diffusing metallic impurities in the semiconductor wafer in the vicinity of the electrically active region causing minority carrier recombination and generation to produce low frequency noise in the current, a gettering region of heavily doped, electrically inactive material comprised of a high concentration of surface damage in the semiconductor crystal lattice and disposed in the first region at the top surface in closely spaced relationship to the electrically active region, the gettering region occupying about 25 to 75 percent of the top surface area of the first region and trapping a sufficient number of metallic impurities originally in the vicinity of the electrically active region such that low frequency noise in the current is substantially reduced when the amplifying circuit is operated.

* * * * *